(12) United States Patent
Chidambarrao et al.

(10) Patent No.: US 7,337,420 B2
(45) Date of Patent: Feb. 26, 2008

(54) METHODOLOGY FOR LAYOUT-BASED MODULATION AND OPTIMIZATION OF NITRIDE LINER STRESS EFFECT IN COMPACT MODELS

(75) Inventors: Dureseti Chidambarrao, Weston, CT (US); Donald L. Jordan, Weybridge, VT (US); Judith H. McCullen, Essex Junction, VT (US); David M. Onsongo, Newburgh, NY (US); Tina Wagner, Newburgh, NY (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 11/193,711

(22) Filed: Jul. 29, 2005

(65) Prior Publication Data

US 2007/0028195 A1 Feb. 1, 2007

(51) Int. Cl.
*G06F 17/50* (2006.01)
(52) U.S. Cl. .................. 716/8; 716/9; 716/1; 716/2
(58) Field of Classification Search ............ 716/8, 716/2, 1, 9
See application file for complete search history.

(56) References Cited

U.S. PATENT DOCUMENTS

| | | | |
|---|---|---|---|
| 6,975,006 B2 * | 12/2005 | Huang et al. ............. 257/410 |
| 7,012,028 B2 * | 3/2006 | Bu et al. .................. 438/733 |
| 7,217,626 B2 * | 5/2007 | Bu et al. .................. 438/303 |
| 2003/0201480 A1 | 10/2003 | Chidambarrao et al. ... 257/301 |
| 2005/0019998 A1 * | 1/2005 | Huang et al. ............. 438/197 |
| 2005/0040460 A1 | 2/2005 | Chidambarrao et al. ... 257/336 |

* cited by examiner

*Primary Examiner*—Sun J Lin
(74) *Attorney, Agent, or Firm*—Scully, Scott, Murphy & Presser, P.C.; H. Daniel Schnurmann

(57) ABSTRACT

System and method for compact model algorithms to accurately account for effects of layout-induced changes in nitride liner stress in semiconductor devices. The layout-sensitive compact model algorithms account for the impact of large layout variation on circuits by implementing algorithms for obtaining the correct stress response approximations and layout extraction algorithms for obtaining the correct geometric parameters that drive the stress response. In particular, these algorithms include specific information from search "buckets" that are directionally-oriented and include directionally-specific distance measurements for analyzing in detail the specific shape neighborhood of the semiconductor device. The algorithms are additionally adapted to enable the modeling and stress impact determination of a device having single stress liner film and dual-stress liners (two different liner films that abut at an interface).

38 Claims, 14 Drawing Sheets

US 7,337,420 B2

METHODOLOGY FOR LAYOUT-BASED MODULATION AND OPTIMIZATION OF NITRIDE LINER STRESS EFFECT IN COMPACT MODELS

BACKGROUND OF THE INVENTION

1. Field of Invention

The invention relates to a technique for determining key transistor model quantities including device mobility for semiconductor devices and, more particularly to a technique for determining how these quantities are affected by the layout of a semiconductor device that uses nitride liner films to apply stress in a transistor device channel.

2. Description of Related Art

Stress can be applied in semiconductor devices to increase the mobility of electrons or holes in such devices. For example, stress can be applied to the channel of field effect transistors (FETs) by using intrinsically stressed films such as the liner film that is used normally in the formation of metal contact (MC) terminals to the source and drain regions of the FET. Stress films can typically be nitride films because nitride films are compatible with the silicon fabrication process steps used for contact formation and etching. Liner films exert stress on an isolated FET gate (also called the "victim" gate) by adhering to adjacent surfaces such as the wafer surface and "pushing" or "pulling" on the gate structures. The stress is transferred primarily through the gate spacers, which are self-aligned to the gate polysilicon (PC). A liner-film with inherent tensile stress transfers tensile stress, and is used for improving electron mobility in n-type FETs (NFETS), while a liner film with inherent compressive stress transfers compressive stress, and is used for improving hole mobility in p-type FETs (PFETs). One factor that dilutes the effectiveness of nitride liners is that the contact metallurgy, particularly to the source and drain regions, requires parts of the liner to be etched away very near the device. This not only disrupts the ability of the long film runway to transfer stress, but also moves the singularity/edge that would influence the channel further away, severely reducing the stress benefit. Other structures that are on the same physical level above the silicon surface such as contact metallurgy and that interrupt the film can also have the same effect. An example of such a structure is polysilicon wiring. Further, an even more serious concern is that these structures can be arbitrarily designed and therefore have a difficult to predict effect on performance, either positive or negative. Layout-dependent factors that influence the stress include the spacing between the victim gate and adjacent structures, the dimensions of these adjacent structures, the amount of contact coverage (or source/drain strapping), and in the case of dual-stress liner technologies (one liner for NFETS and a different liner for PFETS), the proximity of the interface between the two liner films. Small changes in FET layout can introduce noticeable shifts in drive current, and this variation can appear to change device to device across a chip. Not accounting for this magnitude of variation in stress benefit can seriously underpredict or overpredict electrical performance in circuit simulation. Furthermore, with information about the influence of stress on a given layout, circuit designers can optimize their designs for exploiting stress.

Previously developed layout-sensitive effects that have been studied include shallow trench isolation (STI) stress effects and N-Well scattering effects. The STI stress effect is accounted for by obtaining the length and width of the active area (silicon island surrounded by STI) of the semiconductor device and adjusting the mobility as a function of these two parameters. The primary cause of stress in the STI process is that a compressive stress is typically applied in both longitudinal (orthogonal to the gate) and transverse (parallel to the gate) directions, altering the silicon band structure locally. Such a stress degrades the NFETs while benefiting the PFET. The stress-based adjustment is then based purely on empirical data from a set of specifically designed macros that span the complete length/width active area parameter space. Then for any given active area length/width, one can interpolate the results. Moreover, parametric fits to the mobility impact can be experimentally obtained from experimental data.

The N-well scattering effect occurs when implant shadowing of dopant ions scatters to unintended locations from relatively thick resist layers. N-well implant scattering is therefore also layout sensitive, but this sensitivity is unrelated to stress effects. That is, the influence of N-well implant scattering alters the voltage threshold (Vt) of devices that happen to be close by.

This impact causes circuit operability problems and therefore must be properly accounted for. The modeling methodology is to identify the N-well resist proximity based on plan view layout and defining, again through empirical calibration, and based on distances from this N-well resist, the threshold voltage impact of the N-well scattering. One technique for modeling a structure influenced by N-well implant scattering is described in commonly-owned, co-pending U.S. patent application Ser. No. 10/248,853 (Pub. No. US2004/0034517A1).

It would be highly desirable to provide a system and method that extends the above concepts to accurately account for layout-induced changes in nitride liner stress in semiconductor devices.

BRIEF SUMMARY OF THE INVENTION

The present invention provides a system and method that address the above and other issues by providing a computationally efficient technique that accurately accounts for layout-induced changes caused by nitride liner-based stress in semiconductor devices. In particular, the invention uses methods and algorithms to account for the impact of differences in circuit layout style on circuit performance. Such algorithms are implemented for obtaining the appropriate stress functional approximations and in extraction algorithms to obtain the correct geometric parameters.

Features of the invention include a methodology for circuit simulation of layout-dependent features utilizing circuit netlist extraction of layout-dependent compact model quantities.

The invention also provides a circuit netlist extraction algorithm for layout-dependent features. The netlist extraction is performed by a software program ("extractor") that reads information about a specific circuit. The information is typically stored in a graphical data format so that the layout information that it represents can be easily modified. The netlist extraction program implements a "search bucket" approach for computing features such as areas, perimeters, and vertice counts of adjacent local interconnect shapes (denoted by MC) and of poly wiring shapes (denoted by PC). Distance measurements to the interface between stress liner films (denoted by BP) in a dual-stress liner technology can also be determined.

The invention further provides a netlisting algorithm that communicates with a compact modeling program through an interface between the extractor and compact model. The interface includes a set of compact model "instance parameters", which are typically physical quantities such as FET channel length and width that describe the transistor. The invention introduces additional instance parameters that are needed to describe layout-dependent quantities that can be used to compute stress on individual FETs. An interface includes area/perimeter/vertices of shapes found in "search buckets" as well as distances to the nearest interface between the two liner films in the dual stress process. This style of compact-model-extractor interface provides a method for conveying information about different layout styles using an efficient system for treating arbitrary layouts.

The invention also provides a compact model algorithm that receives information through the interface that the compact model uses to input model quantities. In particular, during a first phase, layout-dependent information is passed through the interface that contains non-specific shape information and is converted into specific shape information. Next, stress as seen by the channel due to the liner films is computed in the second phase of the compact model algorithm. Stress is converted to compact model parameters such as channel carrier mobility in the third phase of the compact model algorithm. These parameters may be subsequently used to generate more accurate element values for use in circuit simulation in a further phase of the algorithm.

According to a first aspect of the invention, there is provided a system and method for determining transistor model quantities for a semiconductor transistor device, the device having one or more liner films providing transistor stress effects, the method comprising:

a) converting a representation of physical transistor design information into actual shape dimensions corresponding to said transistor;

b) converting actual shape dimensions into transistor stress levels as contributed by said one or more liner films;

c) generating compact model parameters used in modeling a circuit comprising said transistor device, said compact model parameters including model parameters based on said computed stress levels and used in quantifying the influence of stress effects when modeling said transistor device.

According to this aspect of the invention, the converting step a) includes extracting layout-dependent features of the transistor device, said layout-dependent features utilized to generate said actual shape dimensions. Furthermore, the extracted layout-dependent features include: areas, perimeters, and vertice counts of adjacent local interconnect shapes and polysilicon shapes; and further include: distance measurements to the interface between stress liner films, e.g., in a dual-stress liner technology.

Further to this aspect of the invention, the compact model parameters include channel carrier mobility that is adjusted to account for the influence of liner-stress.

There is provided a further step of computing from the compact model parameters circuit-level quantities used in the simulation of circuits including the transistor device.

According to a second aspect of the invention, there is provided a system and method for optimizing transistor performance that considers the effects of liner film stress applied to each transistor device having one or more liner films. The method comprises steps of:

a) receiving a representation of a circuit layout including said transistor device;

b) extracting layout-dependent features of the transistor device, said layout-dependent features utilized to generate actual shape dimensions of transistor device features;

c) converting actual shape dimensions into transistor stress levels as contributed by said one or more liner films;

d) simulating a circuit using a compact model tool, said simulating including utilizing compact model parameters adjusted according to said transistor stress levels;

e) modifying said circuit layout if said transistor device does not meet a performance goal, and repeating steps a)-e) until a performance goal for said circuit is achieved.

Advantageously, the techniques of the present invention may be applied to enable the modeling and stress impact determination of a device having single stress liner film, and dual-stress liners (two different liner films that abut at an interface). These techniques may also be used in combination with other modeling techniques such as STI stress modeling, N-well implant scatter modeling, and other methods known in the art.

BRIEF DESCRIPTION OF THE DRAWINGS

These and other features, benefits and advantages of the present invention will become apparent by reference to the following text and figures, with like reference numbers referring to like structures across the views, wherein.

DETAILED DESCRIPTION OF THE INVENTION

The present invention extends previously developed layout-sensitive compact model algorithms for other phenomena to accurately account for effects of layout-induced changes in nitride liner stress in semiconductor devices. In particular, the invention accounts for the impact of large layout variation on circuits with algorithms for obtaining the correct stress response approximations and layout extraction algorithms to obtain the correct geometric parameters that drive the stress response. Particularly, these algorithms include specific information in search "buckets" that are directionally-oriented and include directionally-specific distance measurements for analyzing in detail the specific shape neighborhood of the semiconductor device.

Analytical Model and Algorithm

It is problematic to interpolate experimentally-based results for all possible nitride liner case layouts because the layout variations are numerous and typical layout rules are either too complex or too general to predict this variation. Therefore, the experimental data cannot encompass all possible variations, and there will be many situations where extrapolation well beyond the data range with a predictive methodology is needed. The requirements for modeling the layout dependence of the previously mentioned STI stress effect are more straightforward because the design space consists of only the two $L_{RX}$ and $W_{RX}$ parameters. However, in the nitride liner MC etch layout effect, there are many layout dependent parameters such as MC distance, the amount of MC strapping, the number of MC pieces, and the number of parallel MCs. Here, "MC" and "MCBAR" refer to the local interconnect mask forming the metal connections and "PC" refers to the name of the mask used to make the polysilicon gate. Further, these changes should be characterized out to a relatively large distance from the actual device across its entire width. Moreover, within a very short longitudinal distance, many nitride liner "cuts" can impact the stress may be present.

Figure 1:
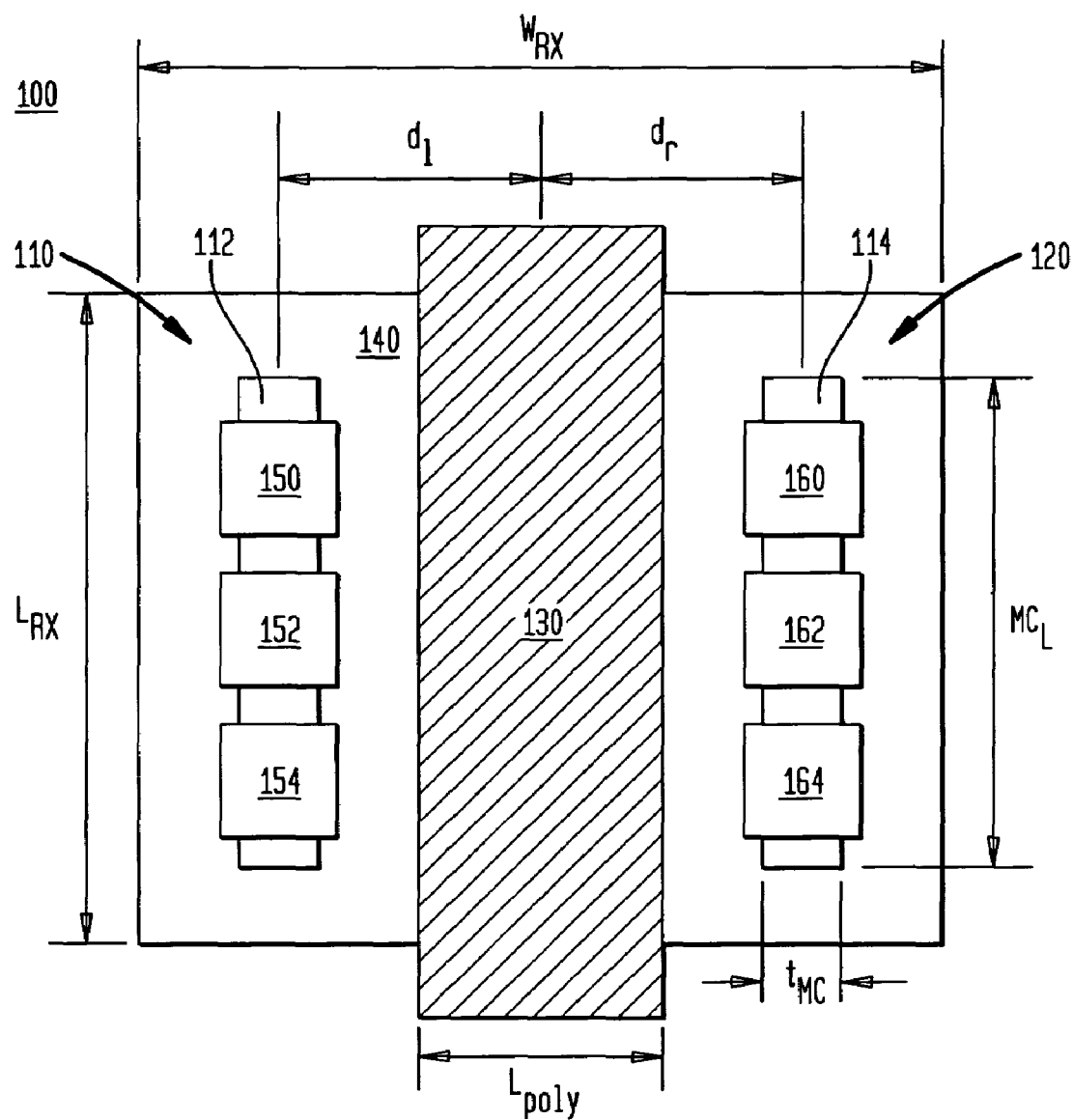
FIG. 1 illustrates an example of a semiconductor device that uses metal contact (MC) strapping.

FIG. 1 shows an example of a semiconductor device, e.g., a FET, suitable for characterizing metal contact (MC) strapping. The device 100 includes a source region 110 and a drain region 120 separated by a polysilicon gate 130. Metal contacts 112 and 114 having a length $MC_L$ and a width $t_{MC}$ are provided at a distance dl and dr from a reference line at the middle of gate 130 on each side of the gate 130 in the source and drain regions 110 and 120, respectively. Example values for $MC_L$ that were used in the model are 0.3 µm and 1.0 µm. An example value for dl and dr that was used in the model is 0.1 µm. The active area (Rx) 140 of the device 100 is $L_{RX} \times W_{RX}$. Additional contacts 150, 152 and 154 are provided for the source 110, while additional contacts 160, 162 and 164 are provided for the drain 120.

The stress function, or response, for such a semiconductor device is complex, three-dimensional, and is sensitive to the amount of MC strapping. Ideally, circuit simulation with layout-dependent stress effects on FET would incorporate TCAD (Technology Computed-Aided Design) simulation. However, one cannot perform a full 3D calculation of stresses for each layout variation because of the high cost in CPU time. With layout variations in the thousands and each individual 3D finite element model (FEM) stress calculation taking hours of CPU runtime, and neglecting the difficulty of setting up the structure up in these 3D FEM codes, the problem is intractable. Even performing 2D calculations linked to the circuit simulators is not possible. The invention addresses these issues by providing an algorithm to approximate all of these complex 3D sets of problems into one analytical model.

Analytical Model

It is a goal of the analytical model is to reduce the complex 3D geometry of the victim gate and the surrounding structures to a "single valued" stress value representing an "average" stress for each device. Then the impact on the device mobility and other important metrics can be evaluated.

Figure 2:
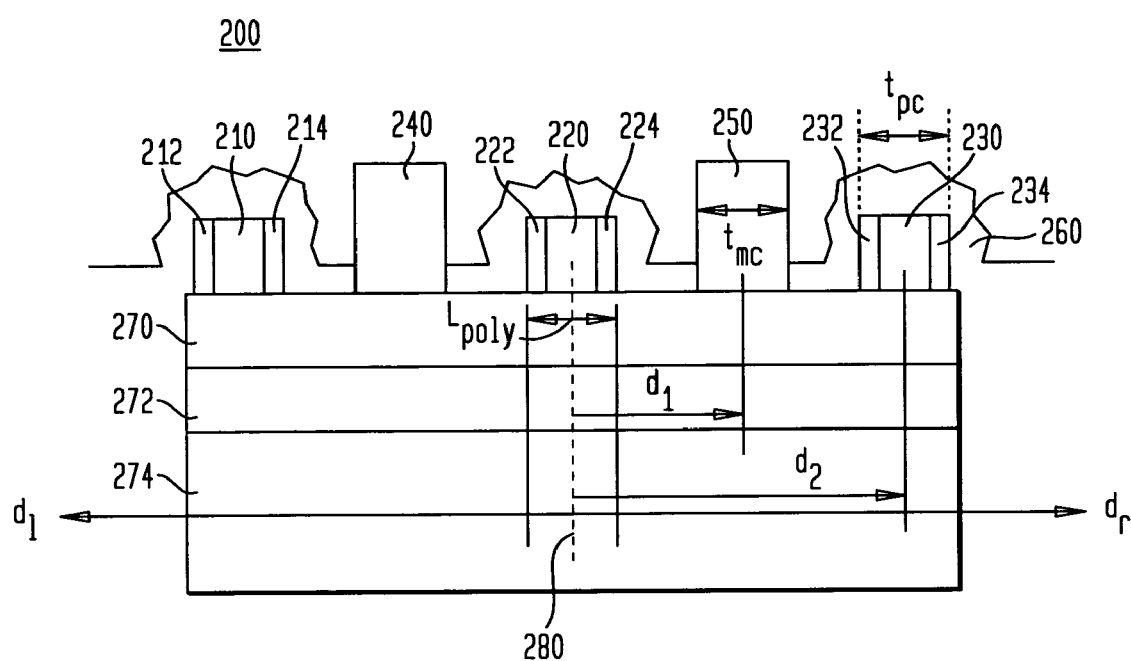
FIG. 2 illustrates a first model, through a cross-sectional view, of a semiconductor device according to the invention.

FIG. 2 illustrates a model of a semiconductor device according to the invention. A cross-sectional view of a semiconductor device analogous to that shown in FIG. 1 is provided. The device 200 includes a number of polysilicon gates 210, 220 and 230 with spacers. Specifically, spacers 212 and 214 are provided for gate 210, spacers 222 and 224 are provided for gate 220, and spacers 232 and 234 are provided for gate 230. The length of the gate (PC) is denoted as $L_{poly}$. Metallic contacts (MC) 240 and 250 are provided between the gates, e.g. for contacting drain/source diffusion regions. The width of the MC (contact) is denoted as $t_{mc}$. Note that additional gates and contacts may be provided as well extending rightward and/or leftward in the device 200. A nitride liner 260 is a film that is provided over the entire surface of the device 200. The device 200 also includes a number of different substrate and/or isolation layers 270, 272 and 274. From a reference line 280 at the center of the gate 220, $d_r$ denotes a distance rightward and $d_l$ denotes a distance leftward. Specifically, "$d_1$" and "$d_2$", respectively, denote distances from the reference line 280 to the respective reference lines at the center of the MC contact 250, and, the center of the gate 230, and the right hand side of the contact 250. It should be understood, that alternatively, the reference line 280 may be located at the right hand side of the gate 220 rather than at the center of the gate as shown in FIG. 2. Thus, using that reference line in that model "$d_1$" may denote a distance from that reference line 280 to the left side of the contact 250, and "$d_2$" may denote a distance from the reference line 280 to the right side of the contact 250.

From the model shown in FIG. 2, and governing equations (1)-(8) below for calculating the "single valued" stress value, variables are needed for implementation within an extraction tool that is used to obtain information such as interconnect resistance and capacitance based on layout design data. The variables needed include: (a) the distances $d_r$, $d_l$ between the victim gate and adjacent PC or MC; (b) the adjacent MC or PC width $t_{MC}$ or $t_{PC}$; and, (c) the adjacent MC or PC lengths $MC_L$ or $PC_L$. It is understood that other distance reference schemes may be used. For example, the distances could be measured in edge-to-edge values instead of center-to-center distances.

Algorithm

The details of the analytical model and the extraction algorithm are now described in greater detail hereinbelow. A generalized flow chart and the relevant equations are included for (a) the extraction, (b) the stress calculator, and (c) the device impact through mobility.

According to the invention, a bucket approach is used with a large number of buckets, with each bucket size limited to the minimum MC size, for example. A "bucket" refers to a two-dimensional search region between the gate and other adjacent shapes. Any shape or portion of a shape that is found in a bucket is represented by the number of vertices in the shape, the total area of the shape, and the perimeter of the shape. Overall this provides a compact and uniform method for describing the shapes in the neighborhood of the gate. By analyzing multiple adjacent buckets, the location and size of adjacent shapes can be determined. It is understood that the N-well scattering impact analysis may also utilize the bucket approach however, the information extracted is very limited and the impact focuses only on Vt change.

For the stress calculations performed in accordance with the invention, the method: (a) seeks many different parameters such as gate orientation, MC and PC location, area, perimeter, in each bucket, (b) uses equations to extract distances from area and perimeter components, (c) links real and perimeter components across buckets, (d) feeds results into an analytical stress calculation, (e) obtains effects on mobility, currents, and other model quantities, (f) obtains BP/BN edge effects which are included through other parameter extraction and stress calculations, where BP and BN are two complementary masks that define the presence of the two different liner films used in semiconductor device technology, and (g) sums all of the various stress effects appropriately.

Figure 3A:
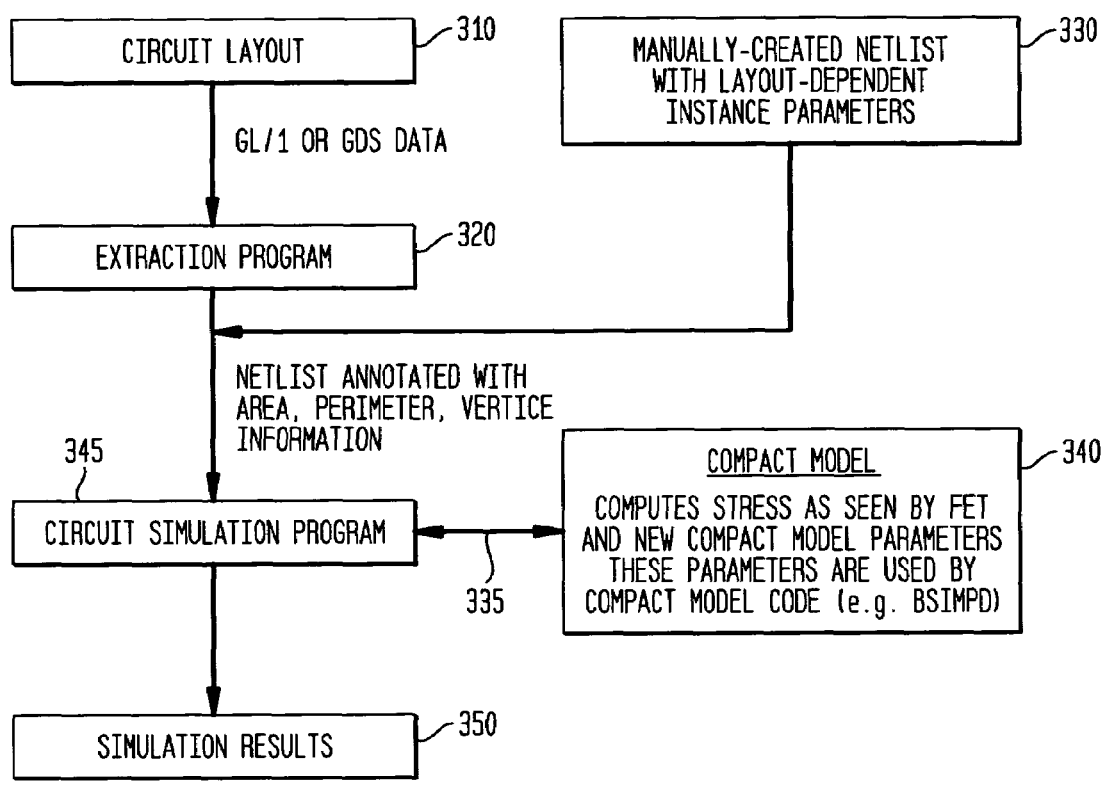
FIGS. 3A and 3B illustrate alternate embodiments for calculating the impact of transistor device stress according to the method of the present invention.

FIG. 3A illustrates a layout extraction algorithm according to one embodiment of the invention. At block 310, circuit layout data is provided, e.g., in a GL1 or GDSII format. GL1 (Graphics Language 1, developed by IBM Corporation) and GDSII (Graphic Data System version 2, developed by GE CALMA) refer to graphics languages that provide a standard file format for transferring and archiving 2D graphical design data. At block 320, according to a first phase of the algorithm, an extraction program is executed to provide a netlist annotated with stress parameters used in the invention including: areas, perimeters, distances and shape vertices. One example extraction program is the Efficient Rapid Integrated Extraction (ERIE) parasitic model extraction tool from IBM Corporation, that typically provides circuit-level netlists from layout design data, and extracts interconnect resistance and capacitance. Other examples of extraction tools include the Calibre tool, available from Mentor Graphics Corp, San Jose, Calif., and the Star-RCXT tool, available from Synopsys, Inc., Mountain View, Calif. Thus, in the first phase of the algorithm, the extraction tool provides layout-dependent information including non-specific shape information.

Referring to FIG. 3A at block 340, according to a second phase of the algorithm, a compact model that is augmented with the stress model algorithms is executed that computes stress as seen by the channel, and according to a third phase of the algorithm, additionally computes effects on device carrier mobilities. The compact model 340 may be a standard BSIM model that is compatible with a circuit simulator such as PowerSPICE, developed by IBM Corporation, Hspice, available from Synopsys, Inc., San Jose, Calif., and/or the Cadence Spectre Circuit Simulator, available from Cadence Design Systems, Inc., San Jose, Calif. BSIM or more specifically, "BSIMPD" refers to compact model code for Silicon-on-insulator (SOI) devices that is publicly available from the University of California, Berkeley. "PD" denotes "partially-depleted", but note that the subject matter disclosed herein is not limited to a specific compact model type.

Thus, according to the second phase of the algorithm, the annotated netlist interface comprising layout-dependent information including non-specific shape information obtained from the extraction tool is converted into specific shape information.

It should be understood that, in one embodiment, the annotated netlist interface information provided by the extraction program may first be compressed into a standard format (an "interface") and that compressed layout description is passed to the compact model. This may be needed due to limitations in the way information is passed between the two programs (extractor and compact model). Alternatively, the layout information may be passed from the extraction program to the compact model without requirement of compression. For example, if there was a software environment in which these two codes were tightly coupled, the extractor could directly pass all of the shape information verbatim to the compact model. One implementation for this method of passing data is a simple linked list of shape coordinates. It is further possible that the conceptual reverse situation is used, meaning that instead of highly-detailed information being passed, less information is passed. This is possible in the case where the semiconductor process (or layout design system) only supports a fixed set of transistor or electrical element layouts, a simplification that is advantageous in some cases. Thus, for example, there may be only 4 transistor layouts or 3 resistor types supported. In that case, the extractor will indicate that a particular transistor design is according to a first layout (e.g., "layout style 1") and the compact model, which knows the stress or layout for layout style 1, immediately knows what stress/modified model parameters to provide.

More particularly, according to the second phase of the algorithm, there is initiated a scanning of the contents of adjacent search buckets on either side of a "victim" gate. By considering restrictions such as physical layout rules, which buckets contain shapes, and the area/perimeter/vertices, the information about the number of shapes and their physical width and length, where width is stored as the location of starting/ending edges of the shapes and length (i.e., "run-length") is defined to be parallel to the edge of the victim gate. The result of the second phase is a list of layout information concerning adjacent shapes on levels such as MC, PC, and liner stress film interfaces (BP/BN interface). It is understood that the algorithm includes a "self" stress term that represents the transistor in isolation, with no nearby layout features that would degrade the stress keeping in mind that reduced stress is considered to be undesirable since high stress of the proper type tends to increase mobility. Using the information in the search buckets, adjacent shapes are analyzed and, as appropriate, the reduction in stress is computed for each adjacent shape. This is done for both left and right sides of the transistor using the PC gate shape as a center reference, and is done for both MC and adjacent PC shapes. BP/BN interface effects are also included.

With the channel stress known, the third phase of the algorithm implements the compact model code which translates the stress into compact model parameters 335 which are utilized by the full compact model equations (such as the previously mentioned BSIM model) and by the circuit simulation program 345 for circuit simulation. This part of the algorithm considers both longitudinal stress (along the direction of current flow in an FET) and transverse stress (parallel to the victim gate). Analytic expressions are used to make this conversion. The modified parameters 335 can include terms such as FET mobility. The compact model parameters are then passed to the compact model code such as the above-referenced BSIM model.

As further shown in FIG. 3A, the circuit simulation program 345 may also receive manually-created netlist input as shown at block 330. Generally, compact models for circuit simulation are CAD tools for circuit design that play an important role in designing nanometer scale systems-on-chip (SOC). In particular, a compact model plays a key role in the accuracy and efficiency of the circuit simulator used by designers, as well as a bridge to the technology in which the design is to be fabricated. Compact models for circuit simulation element such as field-effect transistors include effects such as geometry, bias, temperature, DC, AC, RF, and noise characteristics.

Finally, as shown in FIG. 3A, the circuit simulation program 345 is executed utilizing the new compact model parameters 335 to analyze the electrical performance of various circuit topologies, and simulation results 350 are generated.

Figure 3B:
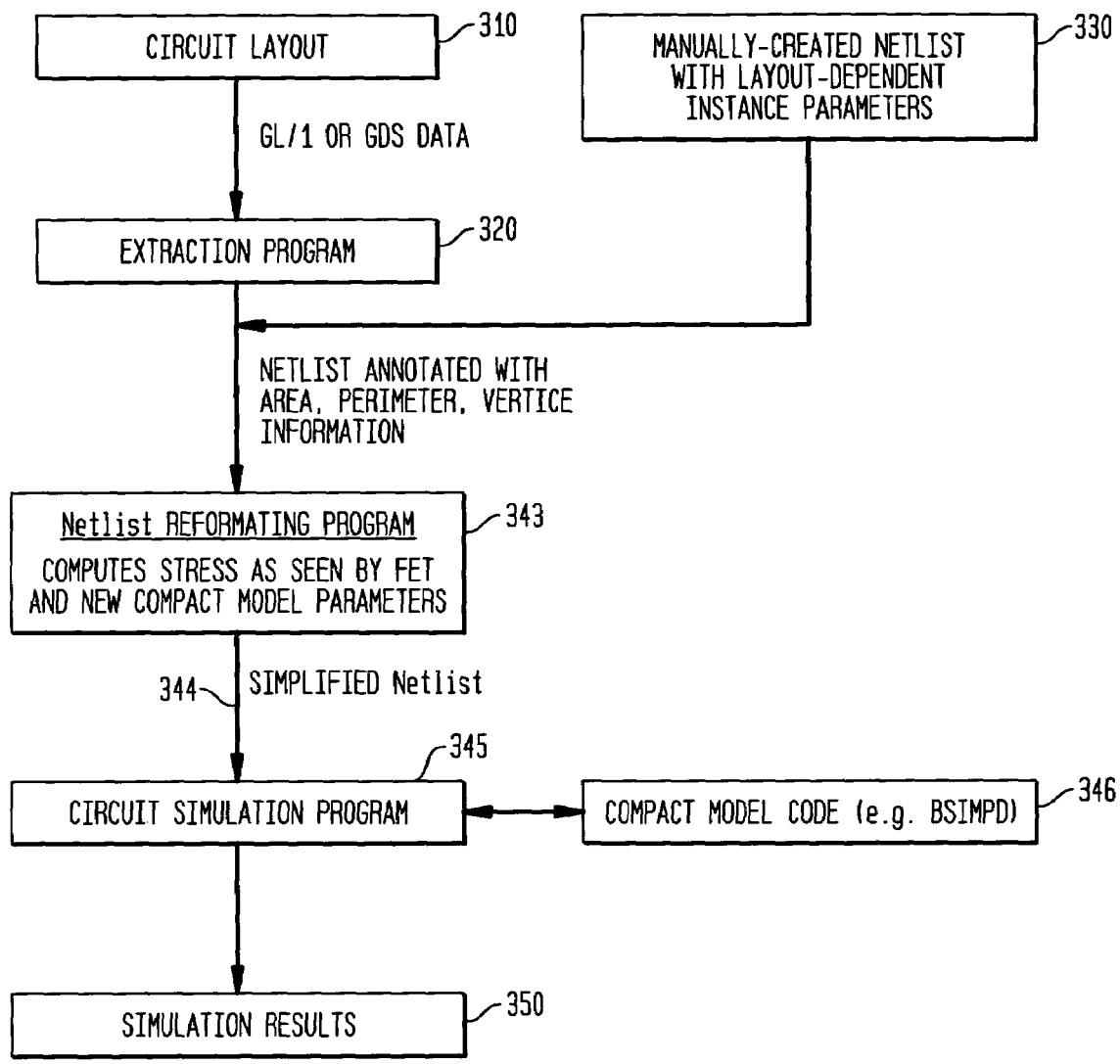

FIG. 3B illustrates an alternative embodiment of layout extraction algorithm according to the invention. In the embodiment depicted in FIG. 3B, it is noted that while the stress model algorithm may be invoked as part of the compact models that are used in circuit simulation, it can also be incorporated in a software application 343 that functions independently of the compact model 346 (with no stress model algorithm) and the circuit simulator 345 for the purpose of simplifying extracted netlists that include stress model instance parameters. In this latter application, an extracted netlist with all layout-dependent stress parameters included is input to the program 343 that calls the stress model algorithm. The stress model algorithm then computes modified FET model parameters (such as mobility) that are needed during circuit simulation and generates a reduced netlist 344 that includes modified FET model parameters instead of the original full set of layout-dependent parameters. The program 343 for netlist reduction could be a separate program, part of the extraction program, or part of the circuit simulator (but not the compact model).

Figure 4A:
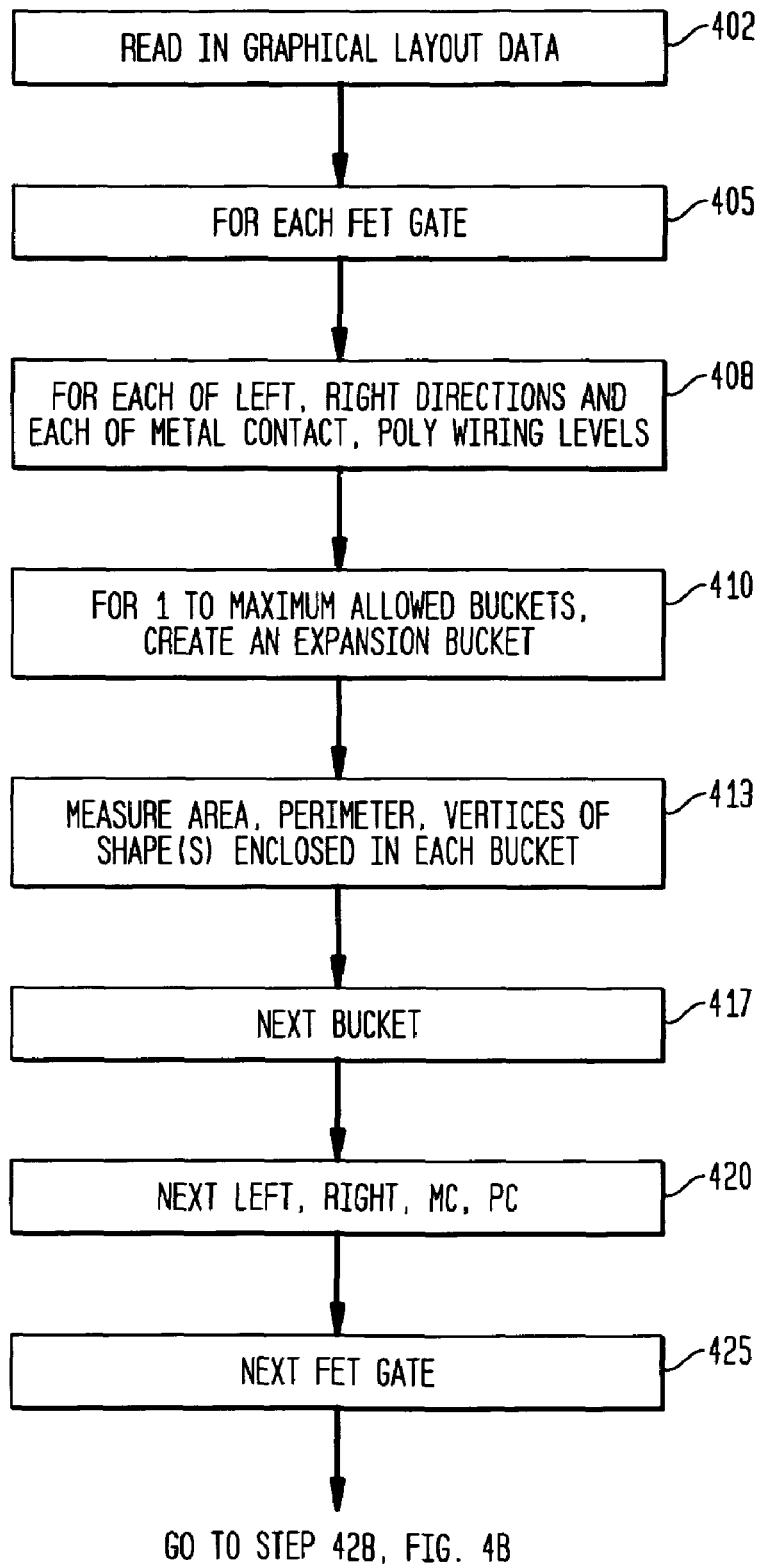
FIGS. 4A and 4B illustrate the methodology implemented by the netlist extraction program 320 shown in FIG. 3A according to the invention.

FIG. 4A illustrates the methodology 400 implemented by the netlist extraction program 320 shown in FIG. 3A. As shown in FIG. 4A, step 402 is the step of inputting the 2D graphical layout data for the circuit. While the invention is generally applicable for modeling performance of all types of circuits and semiconductor devices using the "bucket" approach described herein, for exemplary purposes, the novel process is described with respect to extracting stress parameters from the layout of FET devices. In extracting stress parameters from the layout, two types of extraction can be used. Specifically, gate PC to adjacent PC (PC-PC), gate PC to adjacent MC (PC-MC) extraction (local nearest neighbors analysis using buckets), and BP/BN edge extraction (local/distant shape edge measurement) may be used. PC-PC and PC-MC are performed using buckets, while BP/BN is performed using a distance measurement.

Thus, as shown in FIG. 4A, the following is iteratively performed: for each FET gate 405 included in the circuit, and, for each of left, right directions and each of metal contact (MC), poly wiring levels (PC), shown at a step 408, and for each bucket up to a predetermined maximum allowed, an expansion bucket is generated as indicated at step 410. The bucket approach is now described in greater detail herein with respect to FIG. 5.

Figure 5:
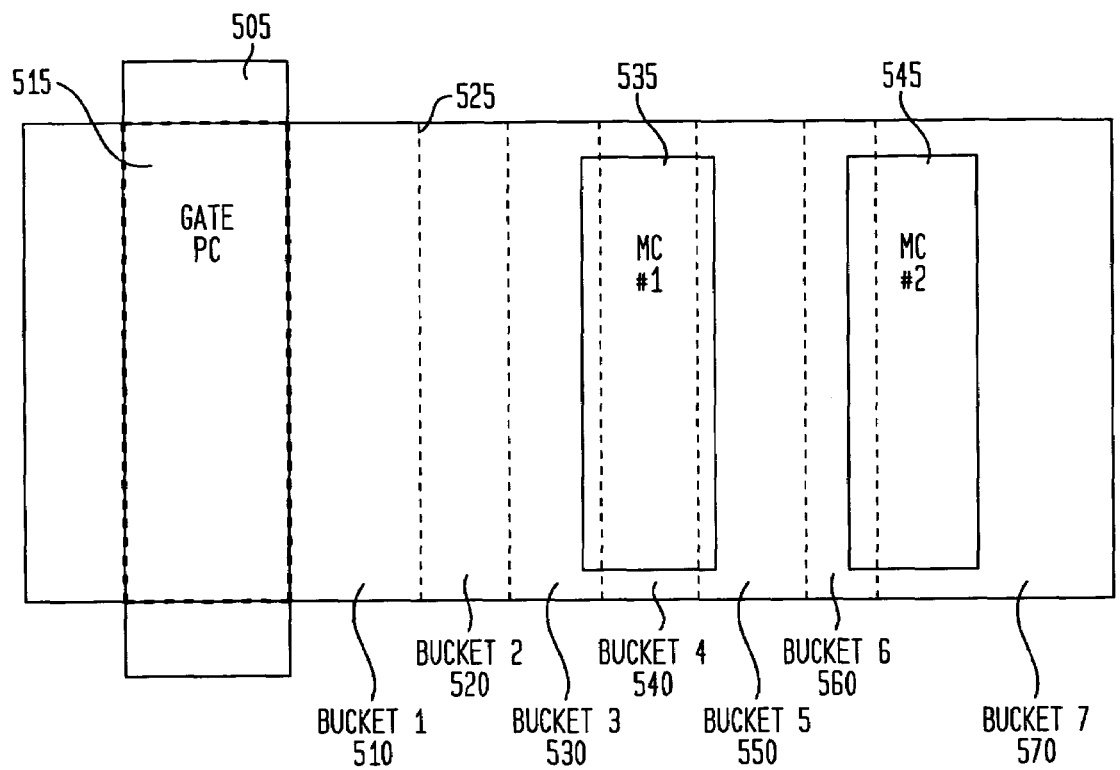
FIG. 5 illustrates an example of gate edge expansion, which is part of the process of forming new buckets, according to the invention.

FIG. 5 illustrates an example of gate edge expansion, which is part of the process of forming new buckets, according to the invention. An example for one side only of a semiconductor device is provided. In the device 500, a gate PC 505 includes a reference gate/FET area 515, also referred to as a "victim gate". A first metal contact (MC) 535 is the first nearest neighbor to the reference gate/FET area 515, while a second metal contact (MC) 545 is the second nearest neighbor. Starting from a reference point, e.g., the right most edge of the gate PC, a number of expansion buckets are provided as bucket 1 (510), bucket 2 (520), bucket 3 (530), bucket 4 (540), bucket 5 (550), bucket 6 (560), and bucket 7 (570). A dashed line 525 represents the areal intersection of PC and Rx expanded by integral amounts in the east, or rightward, direction. Preferably, when a bucket is expanded, only one edge that is parallel to the reference edge is moving, however, it may be appreciated that more than one edge may be moved. For purposes of description, the edge closest to the gate is the reference edge, and the other two edges are fixed by the RX edges that run in the direction of the current flow. Thus, the area enclosed by a bucket counts out from the edge of the reference gate. If a bucket only covers part of a shape (e.g., MC), then only that part is reported in that bucket. Subsequent buckets will capture more of the shape until it is entirely enclosed, assuming it all resides within that last bucket searched. The bucket/size locations are chosen such that if a portion of a new shape is found in the last bucket, this distant fragment can be treated in an approximate manner because of its relatively large distance from the victim gate. As will be described, the compact model is able to reconstruct the shape. One constraint is that the bucket spacing be narrower than the minimum extension of a shape in the current-flow direction and the shape-shape spacing should be larger than bucket width. In this way no bucket contains parts of two different shapes (e.g., different taken in the direction of bucket expansion, not "vertically").

Thus, as is seen in FIG. 5, the use of expansion buckets aids in the determination of location information for the MC structures 535, 545. By knowing the size of each bucket and their expansion in the particular direction (longitudinal or transverse), the position of the MC edges (or PC edges) relative to the reference edge of the victim gate are determinable. From this information, referring back to FIG. 4A, the area, perimeter and vertices of shapes enclosed in each bucket is determined as indicated at step 413. Then, at steps 417, 420, further processing is performed including repeating those process steps for expanding buckets in the left and right directions for subsequent PC/MC and recording the area, perimeter and vertices of shapes enclosed in each bucket. Finally, as indicated at step 425, the process steps are repeated for the next FET gate of the circuit to be modeled.

Figure 4B:
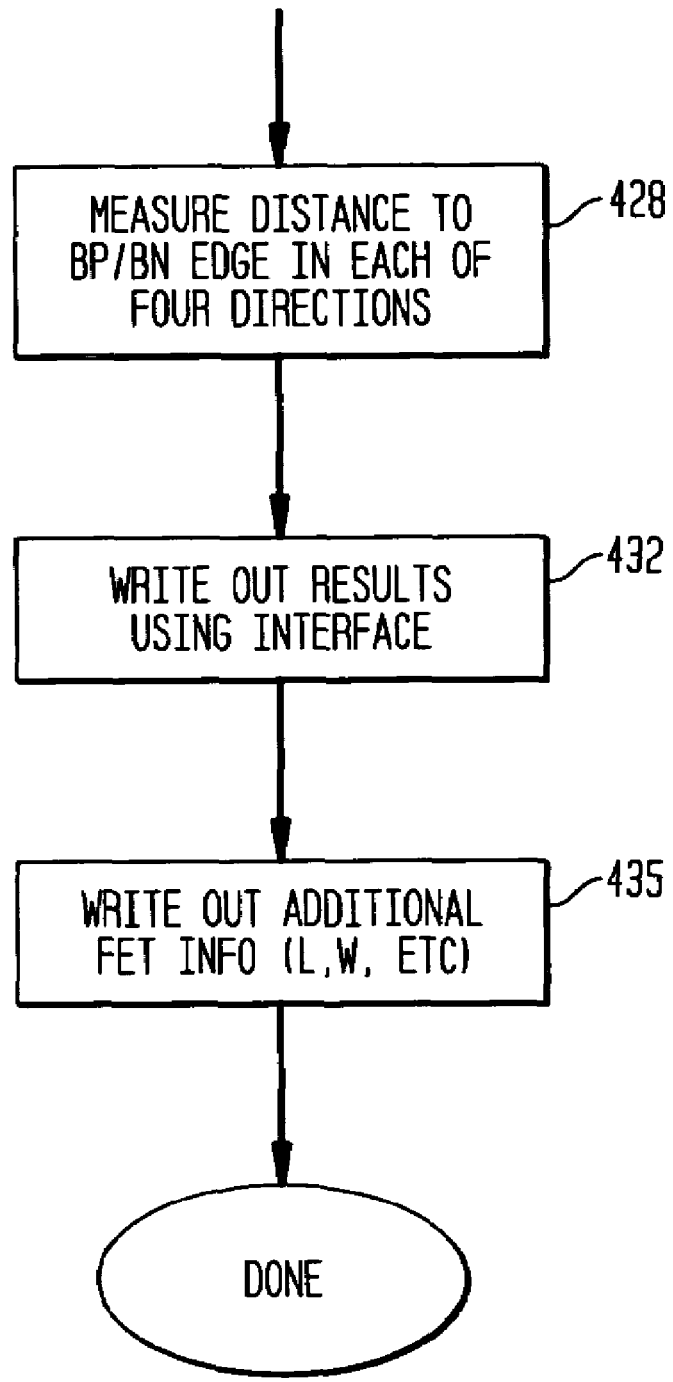
Figure 6:
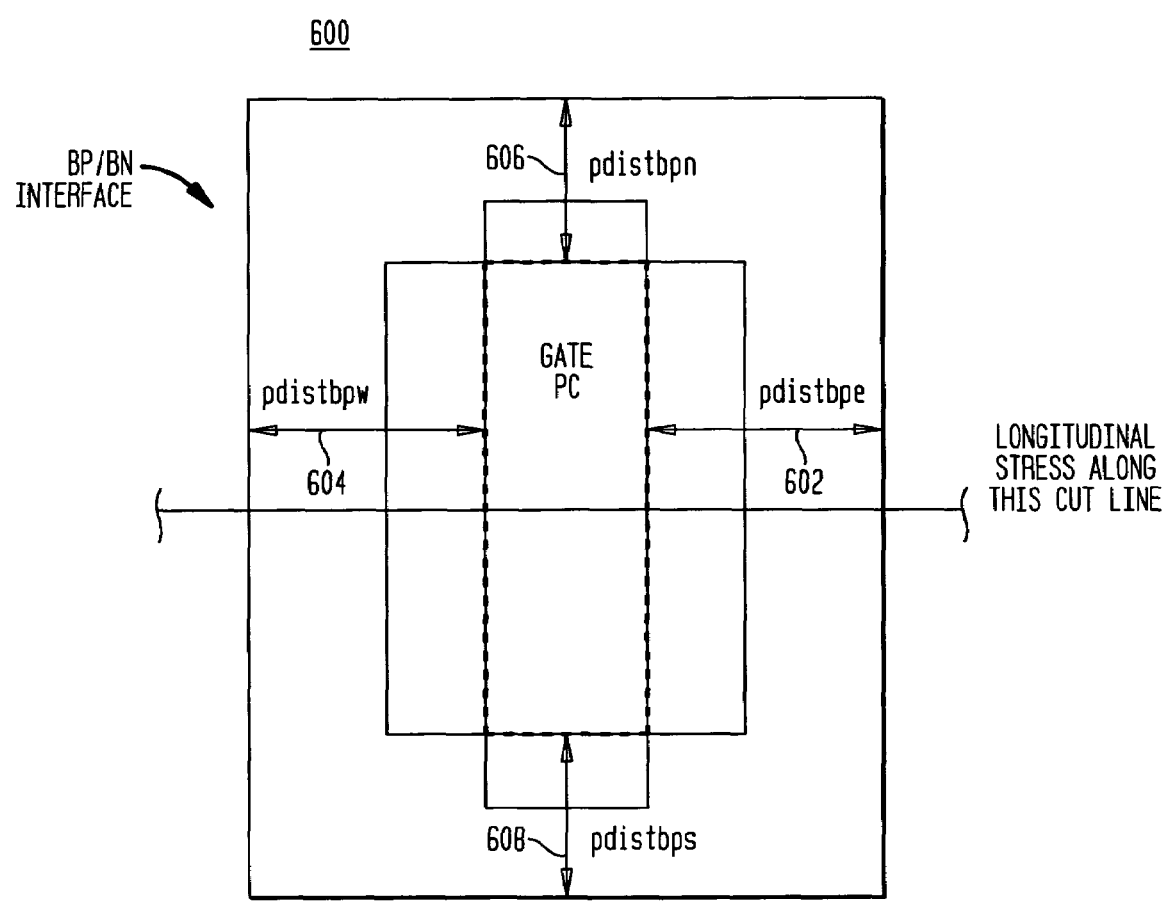
FIG. 6 depicts the BP/BN interface 600 and distances measured to respective BP/BN interfaces from edges defining the gate/FET area 515.

Continuing in FIG. 4B, there is shown the further step 428 comprising steps of measuring the distance to BP/BN edge in each of four (4) compass directions. As shown in FIG. 6, the distance measured includes the distance from the PC gate edges to the interface of the adjacent BP/BN edge (local/distant shape edge measurement). Particularly, FIG. 6 illustrates an example of BN/BP edge detection according to the invention, for the floating-body case (no body tie). The features of this step include direct measurement of the gate edge to adjacent BP/BN interface including distances that are: i) perpendicular to the current flow direction, ii) parallel to the current flow direction, iii) four measurements, and iv) with respect to gate area. As shown in FIG. 6, the four measurements include distances such as: pdistbpe 602, pdistbpw 604, pdistbpn 606 and pdistbps 608 all measured from edges defining the gate/FET area 515 to the BN/BP edge interface. It is understood that this example assumes BP and BN are always complementary.

Referring back to FIG. 4B, the next step 432 is to write out the results to an interface that provides the annotated netlist with extracted area and perimeters to the compact modeling program 340 (FIG. 3A). A first group of additional extractor parameters that the extractor returns from the bucket expansions (PC/MC) that are generated according to the first phase of the algorithm include:

$$p(u)(v)(w)(x) = \text{value(area or perimeter in microns)} \qquad (5)$$

where p(u)(v)(w)(x) is a fixed string that is part of an interface that conveys extracted layout information between the extractor and the compact model: u is a variable having one of four values: n=north, s=south, e=east, w=west; v is a variable having one of three values: a=area, p=perimeter and v=vertice count; w is a variable having one of two values: PC is a flag indicating PC shape, and CT is a flag indicating MC shape; and x represents the bucket number. A second group of additional extractor parameters that the extractor returns as part of the interface from the bucket expansions (BP/BN edge) generated according to the first phase of the algorithm are as follows:

$$\text{pdistbp}(u) = \text{value(scaled distance in microns)},$$

where pdistbp(u) is a fixed string; and u is a variable indicating one or four values: n=north, s=south, e=east, w=west.

It is understood that the traditional extracted information such as the length and width of the poly gate, etc. are also provided to the interface as indicated at step 435.

Figure 7:
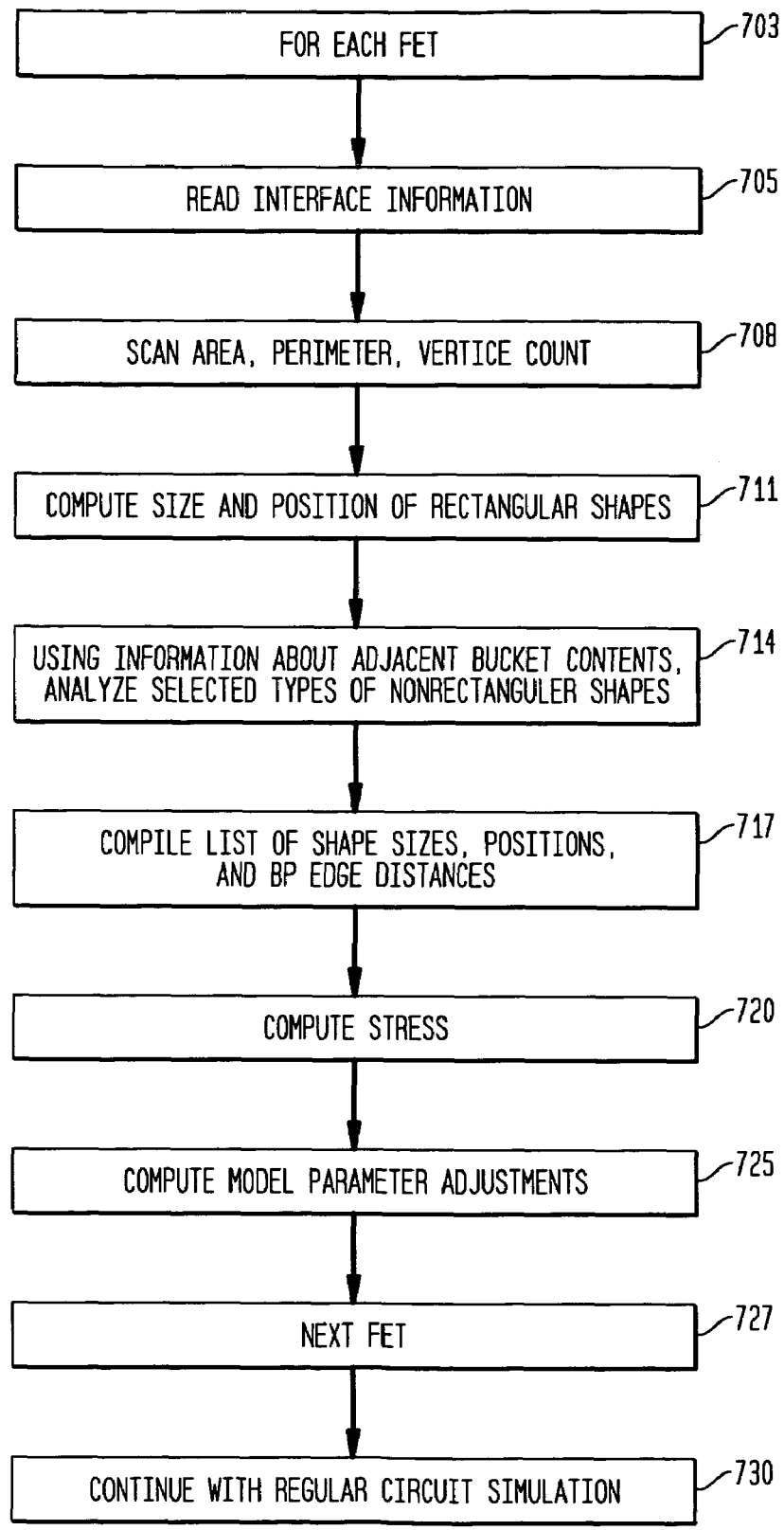
FIG. 7 illustrates the methodology implemented by the compact model program 340 shown in FIG. 3A according to the invention.

Referring now to FIG. 7, there is a flow chart depicting the methodology 700 used in compact model/circuit simulation according to the invention as performed by the compact modeling program 340 as shown in FIG. 3A. A first step 703 indicates that the subsequent processing steps to be performed pertain to each FET to be modeled. As next shown in FIG. 7, step 705, there is depicted the step of reading the annotated netlist interface information provided by the extraction program. The next step 708 involves scanning the relevant netlist information including the new parameters representing the the area, perimeter, vertice count for each of the included features of the semiconductor FET device. From the scanned annotated netlist information obtained at step 708, the next step 711 involves computing the size and position of the rectangular (feature) shapes in the device. Using the information about adjacent bucket contents, selected types of non-rectanguler shapes may be further analyzed such as shown at step 714. Then, a list of shape sizes, positions, and BP/BN interface distances is compiled as indicated at step 717. Further, the values of the actual shape dimensions are computed in the compact model from the information passed through the extractor-compact model interface and derived by the extraction program. From this information, the stresses as seen by the gate channel are computed as indicated at step 720.

More particularly, the input parameters obtained by the extraction tool that are used in computing stresses as seen by the gate channel due to the presence of additional adjacent shapes (e.g., MC, PC and BP/BN interface) in the compact model are now described hereinbelow in view of equations (1)-(8).

As the analytical model is designed to reduce the complex 3D geometry to an "average" stress for each device, the impact on the device mobility and other important metrics can be evaluated. In the following equation 1), the stress is assumed to be uniform and is therefore taken as a single, average value. According to equation 1, a total stress "σ" given in megaPascals, for example, is calculated as:

$$\sigma = \sigma^L - \sigma^T \qquad (1)$$

where $\sigma^L$ is the liner induced stress in the longitudinal direction (parallel to current flow) and is governed according to equation 2(a) as follows:

$$\sigma^L = \sigma_{self} - \sigma_{mc} - \sigma_{pc} - \sigma_{Bp}^L \qquad (2a)$$

and, where $\sigma^T$ is the liner induced stress in the transverse direction (perpendicular to current flow) and is governed according to equation 2(b) as follows:

$$\sigma_T = \sigma_{Bp}^T + \sigma_{body\ contact} \qquad (2b)$$

In accordance with equations (2a) and (2b), the following terms are defined:

$$\sigma_{self} = f_1(L_{poly}\ \text{of victim gate}) \qquad (3)$$

represents a nominal self stress term that represents the transistor in isolation where $f_1$ a polynomial weighting function inversely dependent upon the gate length $L_{poly}$ of the "victim gate" of the FET that is being analyzed;

$$\sigma_{mc} = \sum_{\substack{left,right \\ shapes}} \left[ \frac{k_1(d_i + t_{mc}/2) - k_2(d_i - t_{mc}/2)}{(d_i + t_{mc}/2)(d_i - t_{mc}/2)} \frac{MC_L}{W_{poly}} \right] I_{mc} \qquad (4)$$

represents a stress term contributed by the additional adjacent MC shapes introduced through the summation terms (one for the left side of the gate, the other for the right side); and, $$\sigma_{pc} = \sum_{left,right} \left[ \frac{k_1(d_i + t_{pc}/2) - k_2(d_i - t_{pc}/2)}{(d_i + t_{pc}/2)(d_i - t_{pc}/2)} \frac{PC_L}{W_{poly}} \right] I_{pc} \qquad (5)$$

represents a stress term contributed by the PC shapes introduced through the summation terms (one for the left side of the gate, the other for the right side), The definition of terms for stress equations due to MC and PC shapes include the following:

$k_1$, $k_2$=stiffness coefficients for MC (varies for PFETS or NFETs); i.e., the stiffness coefficients $k_1$, $k_2$ are technology sensitive since they include stiffness values that include effects due to spacer size, poly thickness, etc.;

$d_i$=distance between center of victim gate and center of adjacent shape (MC) (See FIG. 2 where di is denoted as $d_l$ and $d_r$);

$t_{mc}$=width of MC (in direction of current flow);

$t_{pc}$=width of PC (in direction of current flow);

$MC_L$, $PC_L$=runlength of MC (PC) shape (perpendicular to current flow);

$W_{poly}$=width of victim gate (parallel to current flow); and $I_{mc}/I_{pc}$=shape-to-shape interaction terms (varies for PFETS or NFETs);

It is understood that the details of the nitride film process are reflected in the model since the stiffness coefficients and thickness of the films can be used in the equations.

In the following equations, $\sigma_{Bp}^L$ represents a stress term contributed by the BP edge effect term in the longitudinal direction due to presence of the liner film; $\sigma_{Bp}^T$ represents a stress term contributed by the BP edge effect term in the transverse direction due to presence of the liner film; and, $\sigma_{body-contact}$ represents a body contact stress term that is present only if the transistor has an SOI body contact.

Utilizing the BP/BN distance measurements obtained via the extraction tool, the stress $\sigma_{Bp}{}^L$ stress term contributed by the BP edge effect term in the longitudinal direction due to presence of the liner film is computed as:

$$\sigma_{BP}^L = C_{1j}\left(\frac{\frac{1}{pdistbpe}+}{\frac{1}{pdistbpw}}\right) - C_{2j}\left(\frac{\frac{1}{pdistbpe}+}{\frac{1}{pdistbpw}}\right) \quad (6)$$

where fitting parameters $C_{1j}$, $C_{2j}$ are different for NFETs, PFETs. Likewise, the $\sigma_{Bp}{}^T$ stress term contributed by the BP edge effect term in the transverse direction due to presence of the liner film is computed as:

$$\sigma_{BP}^T = C_{3j}\left(\frac{\frac{1}{pdistbpn}+}{\frac{1}{pdistbpn+W_{poly}}}\right) + C_{3j}\left(\frac{\frac{1}{pdistpbs}+}{\frac{1}{pdistbps+W_{poly}}}\right) \quad (7)$$

where fitting parameters $C_{3j}$ is different for NFETs, PFETs. The term $\sigma_{body\text{-}contact}$ represents a body contact stress term and is computed as:

$$\sigma_{body\text{-}contact} = C_{4j}\left(\frac{1}{\alpha W_{poly}} + \frac{1}{W_{poly}}\right) \quad (8)$$

where $\alpha$ and $C_{4j}$ are fitting parameters.

In further view of FIG. 7, continuing at step 725, there is depicted the step of computing model parameter adjustments based accordingly on the stress values computed at step 720. This step involves computing an adjusted carrier mobility value $\mu_O^S$ according to equation (9) as follows:

$$\mu_O^S = \mu_O^{original}[f_2(\sigma^L, \sigma^T)] \quad (9)$$

where $\mu_O^{original}$ is the nominal carrier mobility value (calibrated to a reference stress level); and $f_2$ is a polynomial weighting function that is a function of the calculated longitudinal stress $\sigma^L$ and the transverse stress $\sigma^T$. Additional relationships between the computed stress values and other compact model parameters such as threshold or mobility sensitivity to vertical electric field are additionally contemplated.

Finally, as indicated at step 727, the process steps depicted in FIG. 7 are repeated for the next FET in the circuit, and the compact modeling program continues with the regular circuit simulations only now utilizing more accurate modeling that accounts for liner stress-induced factors. Only until the other FET model parameters have been adjusted to account for the stress effects, will the regular circuit simulations commence, as indicated at step 730. In the regular circuit simulations, circuit-level quantities may be computed from the compact model parameters. That is, the compact model code adapted for determining terminal currents and charge is then used to generate terms for use in circuit simulation in a further phase of the algorithm. The compact model code can be a conventional code that is readily available from academia (such as a BSIM model) or a custom code that has been developed for stress modeling.

Figure 8A:
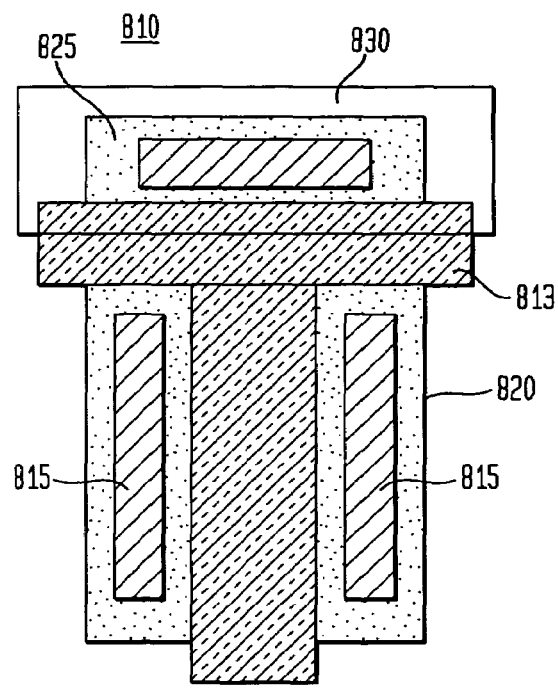
FIGS. 8A and 8B illustrate examples of the more complex FET arrangements capable of being analyzed by the methodology of the invention.
Figure 8B:
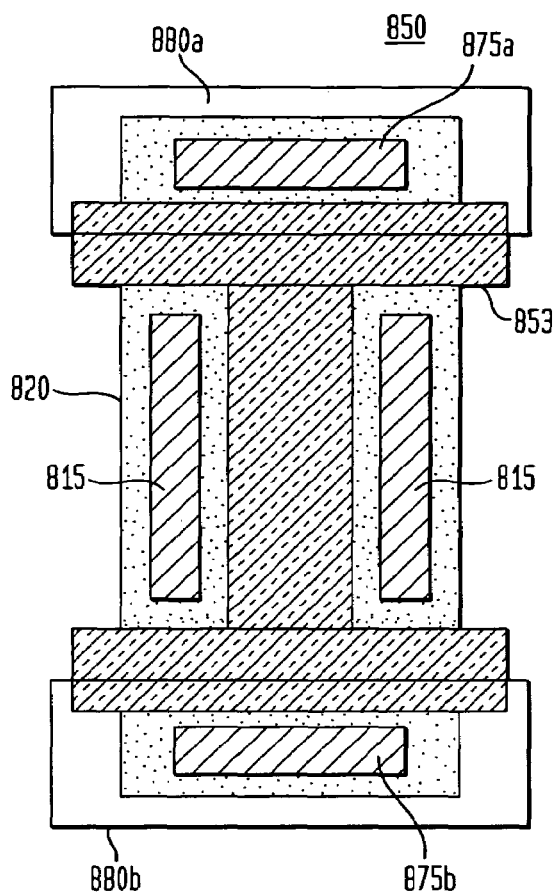

It should be understood that the methodology of the present invention is capable of handling semiconductor devices having more complex shapes than the common FET device arrangements. FIGS. 8A and 8B illustrate examples of the more complex FET arrangements capable of being analyzed by the methodology of the invention. As shown in FIG. 8A, the method of the invention is enabled to extract additional area, perimeter and vertice parameters (in buckets) used for stress calculations for a "T-style" body contact FET device 810, and an "H-style" body contact FET device 850. The T-style body contact FET device layout 810 shown in FIG. 8A includes the PC (gate) 813, MC drain and source contacts 815, RX (diffusion) 820, MC (body contact) 825 and BP edge 830 portions, while an H-style body contact FET device layout 850 shown in FIG. 8B includes the PC (gate) 853, MC drain and source contacts 815, RX (diffusion) 820, MC (body contact) regions 875a, 875b portions including respective BP edges 880a, 880b. All sizes of these features sizes can be fixed by ground rules that allow the additional stress contribution to be modeled using equations such as equation (8). The accuracy of the analytical model in representing the average stress has been verified by the data presented in FIGS. 9-12, where the analytical model of the invention, with the correct stiffness coefficients, is compared with finite element results.

Figure 9A:
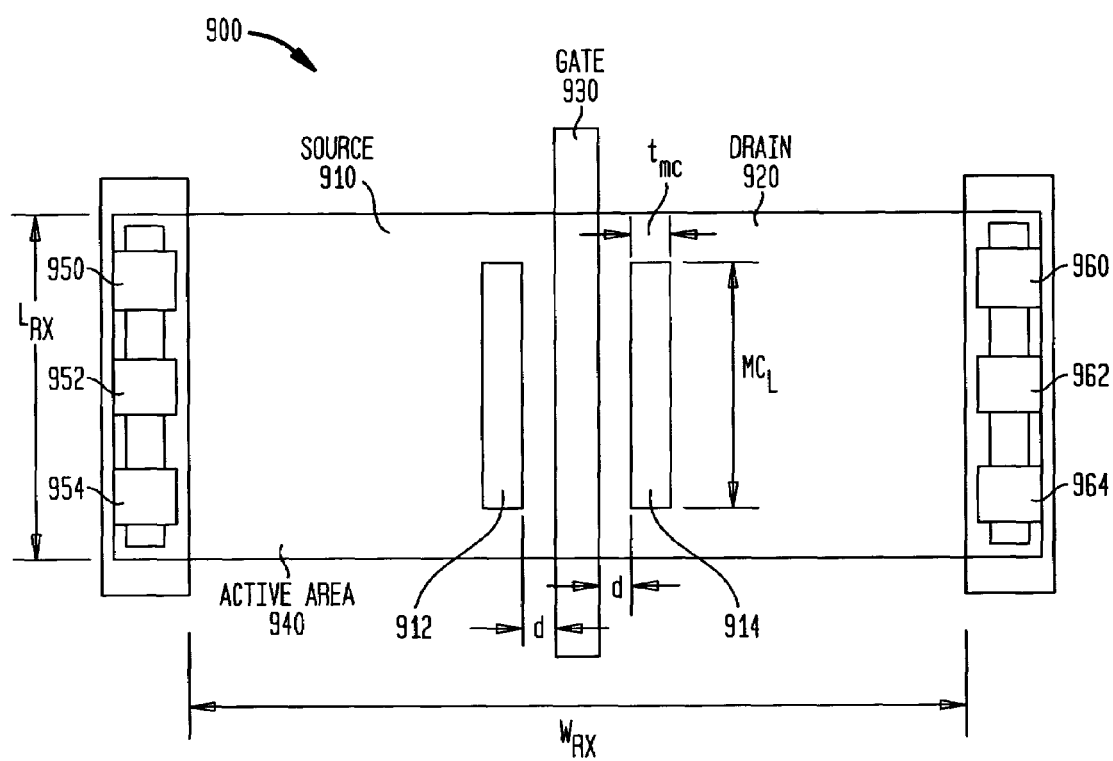
FIG. 9A depicts a further example FET structure for measuring MC strapping effect; and, FIG. 9B illustrates a graph showing channel stress versus percent metal contact (MC) strapping obtained from: (a) finite element model (FEM) stress calculations and (b) device data.

In particular, FIG. 9A shows an example FET structure for measuring MC strapping effect. Strapping is varied by changing the $MC_L$ (MC length) dimension. Thus, as shown in FIG. 9A, a device 900 includes a source region 910 and a drain region 920 separated by a polysilicon gate 930. Dummy metal contacts 912 and 914 having a length $MC_L$ and a width $t_{MC}$ are provided at a distance d on each side of the gate 930 in the source and drain regions 910 and 920, respectively.

Example values for $MC_L$ that were used in the model are 0.3 μm and 1.0 μm. "d" represents a dummy MC-PC distance in μm, and is the variable varied on the x-axis in FIG. 9A. An example value for d that was used in the model is 0.1 μm. The active area (Rx) 940 of the device 900 is $L_{RX} \times W_{RX}$. Measurement contacts 950, 952 and 954 are provided for the source 910, while additional contacts 960, 962 and 964 are provided for the drain 920.

Figure 9B:
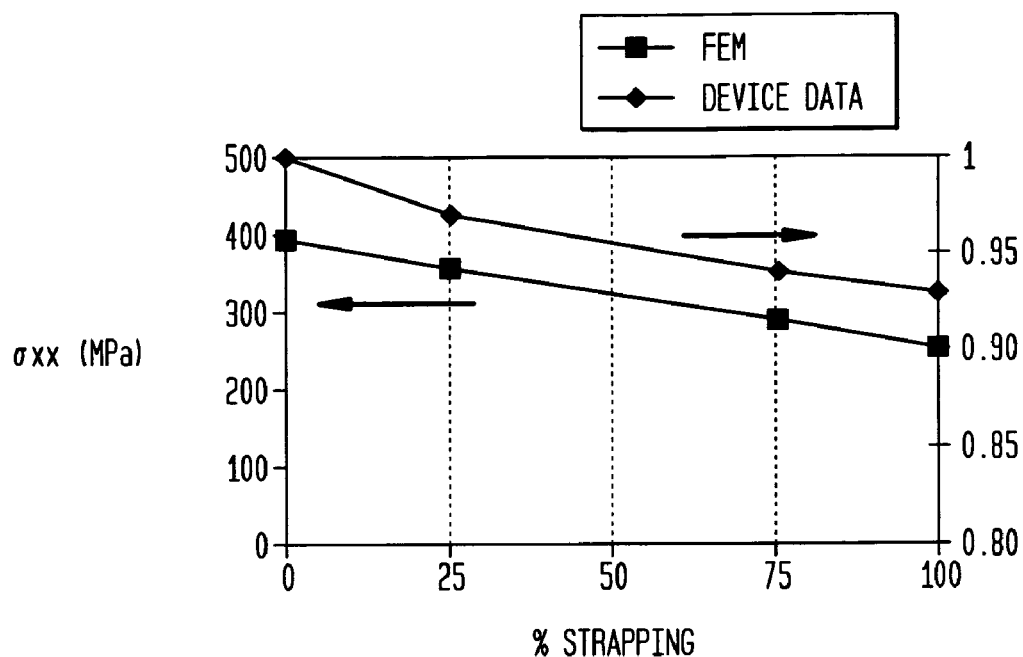

FIG. 9B illustrates a graph showing channel stress versus percent metal contact (MC) strapping obtained from: (a) finite element model (FEM) stress calculations and (b) device data. The x-axis indicates the percent of strapping, between 0% and 100%, while the left hand y-axis indicates the stress in units of megaPascals (MPa) for the FEM simulation results, and the right hand y-axis indicates a normalized, unitless stress value for the analytical model of the invention. The graph verifies that the FEM simulation results generally track the device data.

Figure 10:
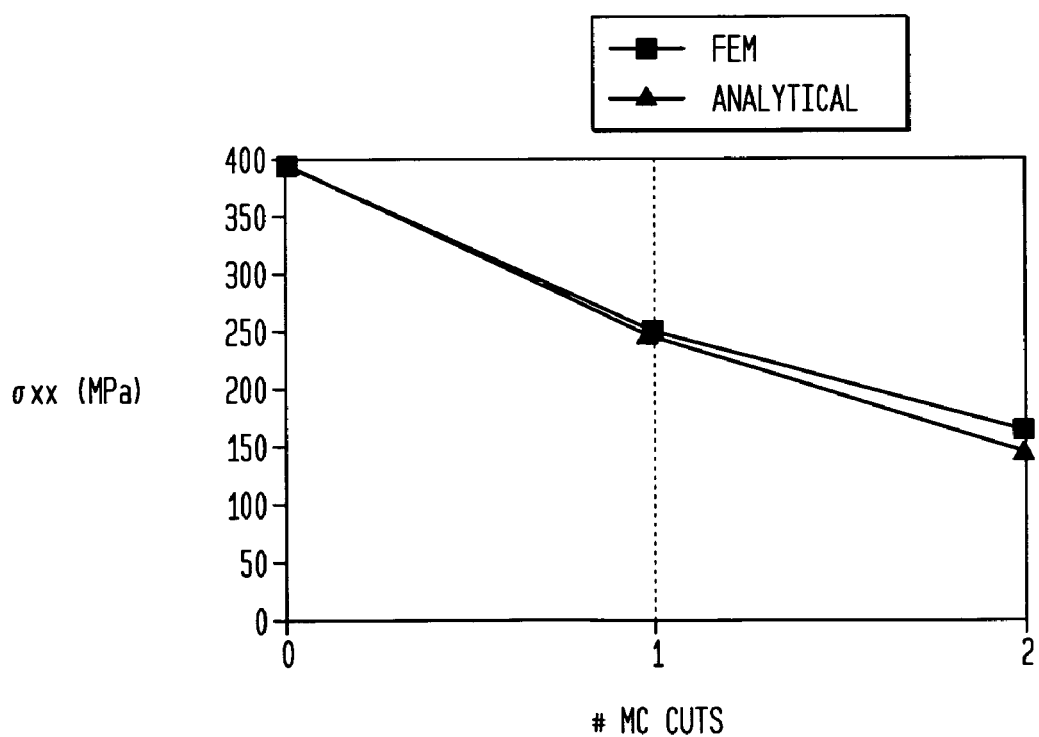
FIG. 10 illustrates a graph showing channel stress versus number of metal contact (MC) cuts obtained from: (a) finite element model (FEM) stress calculations and (b) analytical calculations using an analytical model and algorithm according to the invention.

FIG. 10 illustrates a graph showing channel stress versus number of metal contact (MC) cuts between the victim gate and the contacts obtained from: (a) finite element model (FEM) stress calculations and (b) analytical calculations using an analytical model and algorithm according to the invention. The x-axis indicates the number of MC cuts, e.g., zero, one or two, while the y-axis indicates the stress in units of MPa for both the finite element simulation results and the analytical model of the invention. The graph verifies that the analytical model closely tracks the FEM results.

Figure 11:
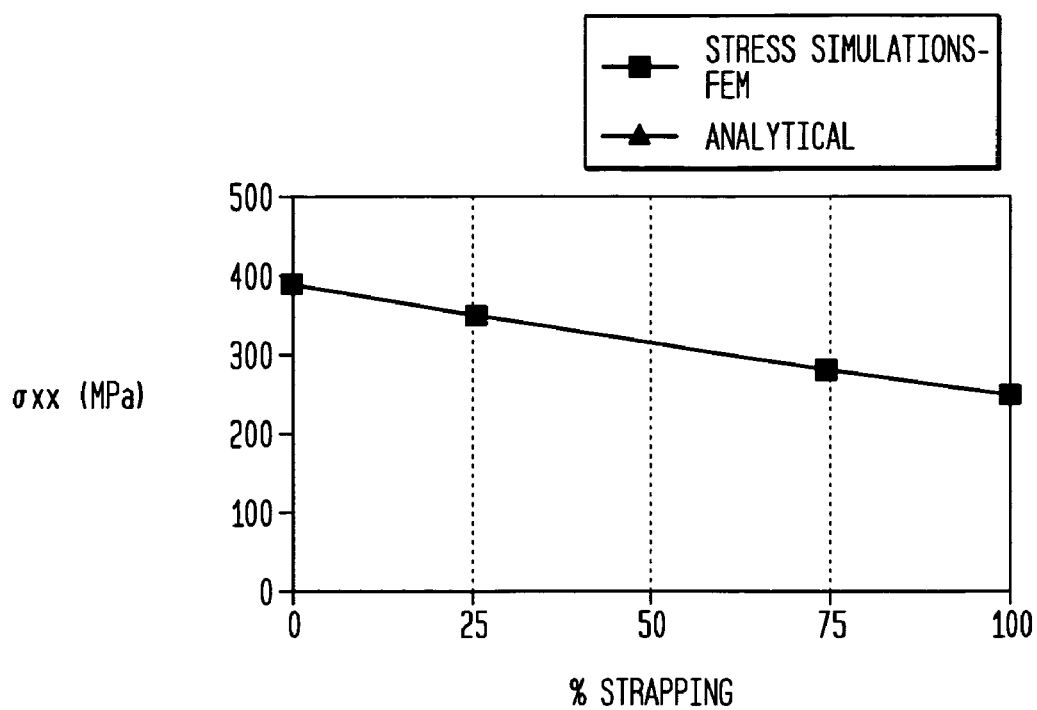
FIG. 11 illustrates a graph showing channel stress versus percent MC strapping obtained from: (a) finite element model (FEM) stress calculations and (b) analytical calculations using an analytical model and algorithm according to the invention.

FIG. 11 illustrates a graph showing channel stress versus percent MC strapping obtained from: (a) finite element model (FEM) stress calculations and (b) analytical calculations using an analytical model and algorithm according to the invention. The x-axis indicates the percent of strapping, between 0% and 100%, while the y-axis indicates the stress in units of MPa for both the finite element simulation results and the analytical model of the invention. The graph verifies that the analytical model closely tracks the FEM results.

Figure 12:
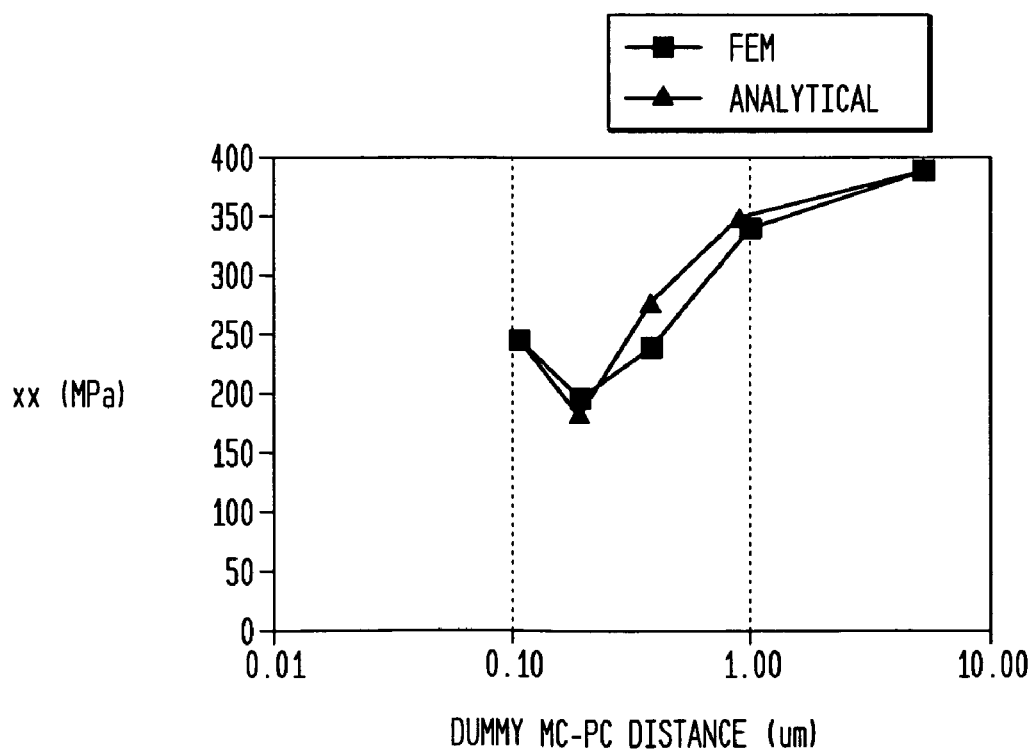
FIG. 12 illustrates a graph showing channel stress versus MC distance obtained from: (a) finite element model (FEM) stress calculations and (b) analytical calculations using an analytical model and algorithm according to the invention; and, FIG. 13 is a flowchart depicting the steps for using the stress-enabled compact model to optimize circuit designs.

FIG. 12 illustrates a graph showing channel stress versus MC distance obtained from: (a) finite element model (FEM) stress calculations and (b) analytical calculations using an analytical model and algorithm according to the invention. The logarithmic x-axis indicates the MC-PC distance in units of μm, while the y-axis indicates the stress in units of MPa for both the finite element simulation results and the analytical model of the invention. The graph again verifies that the analytical model closely tracks the FEM results.

According to a further aspect of the present invention, there is provided a computer-implemented system and method for optimizing design of semiconductor devices such as a semiconductor transistor device, that is designed with to have one or more liner films providing transistor stress. The ability to model liner film stress effects gives circuit designers the ability to optimize their circuits for stress effects.

In general, the presence of adjacent shapes tends to degrade the stress seen by the victim gate and therefore reduces performance. An example is a local interconnect (MC) shape adjacent to the victim gate. Generally the stress decreases as the MC shape is positioned closer to the victim gate. The stress increases as the MC strapping factor is decreased because of the smaller interruption of the liner film. However these changes affect other aspects of the electrical response of the transistor. For example, moving the MC shape closer to the gate increases capacitive coupling with the gate, which is generally a negative factor, and reducing the strapping factor increases the effective series resistance of the transistor, which is also a negative factor. Other factors such as adjacent PC wiring/gates can also influence the stress response. For example, close PC gates tends to improve performance but reduce stress. Adjacent PC wiring may reduce wiring resistance but also reduce stress. Therefore, since there are design tradeoffs between stress and other circuit electrical factors, it is desirable to use the stress-enabled compact model to optimize the circuit response.

Figure 13:
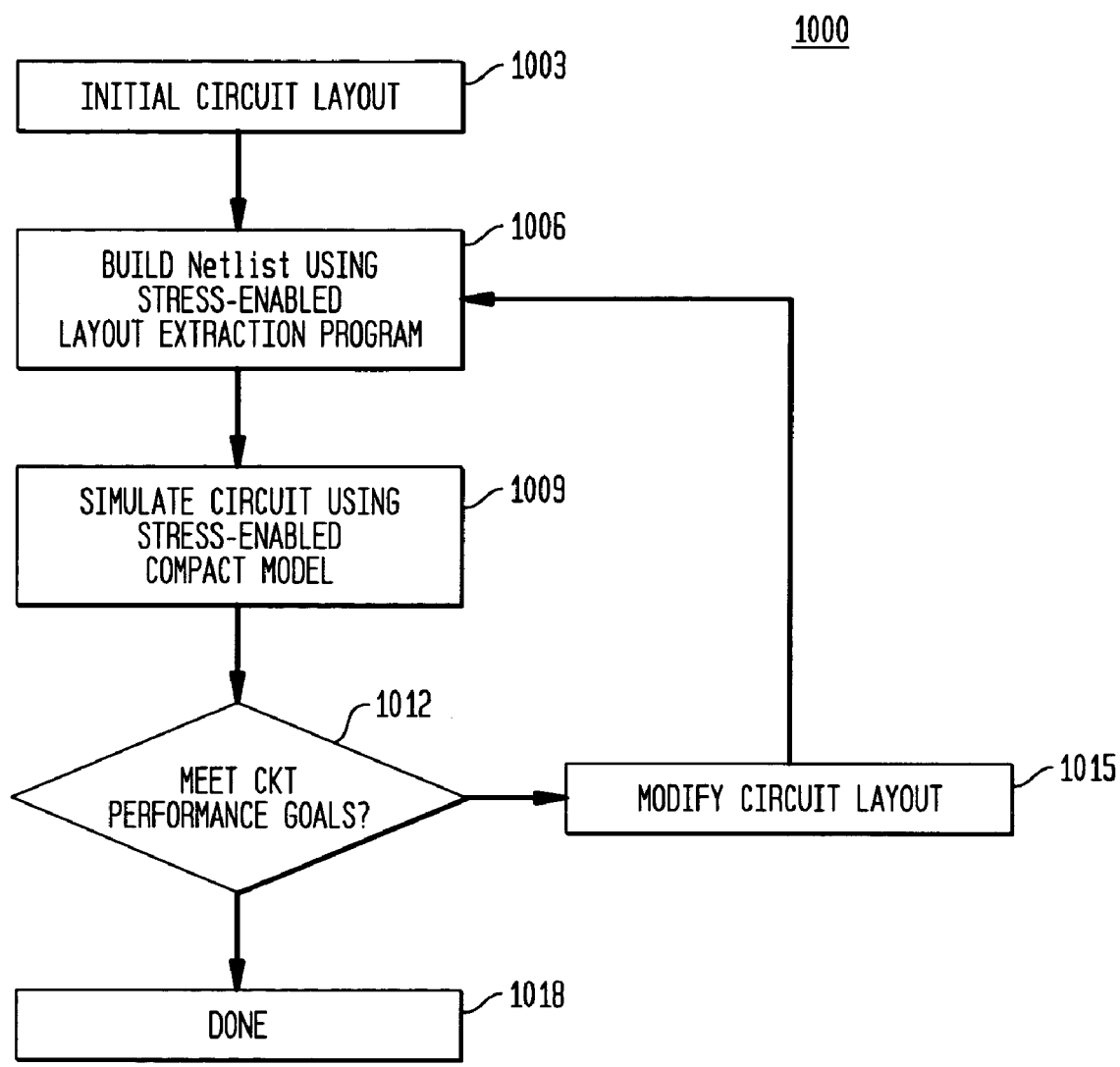

FIG. 13 is a flowchart 1000 depicting the steps for using the stress-enabled compact model to optimize circuit designs. The process consists of an iterative loop between circuit layout, extraction, the compact model, and circuit simulation. The optimization could either be manually performed or driven by an optimization program that uses techniques such as a Newton hill-climbing approach or a genetic algorithm approach or other methods. Circuit layout modifications can be done manually or using an automated program. As shown in a first step 1003, there is depicted the step of providing the initial circuit layout, including, for example, reading in graphical layout data of devices in the circuit. Then, at a step 1006, a netlist is built using the stress-enabled layout extraction program as described herein with respect to FIGS. 4-7.

Continuing next to step 1009, there is depicted the step of simulating the designed circuit using the stress-enabled compact model. The next step 1012 involves determining whether the circuit performance goals have been achieved for that particular design. If the performance goals have been met, then the process terminates at step 1018; otherwise, if the designed circuit did not meet those performance goals, the circuit design may be modified as indicated at step 1015 and the process returns to step 1006 in order to build a new netlist using the stress-enabled layout extractor program.

The techniques discussed herein can be implemented using appropriate computing resources, including processing and program storage, or memory, resources. One or more processors can execute any type of computer code devices, such as software, firmware, micro code or the like, to achieve the functionality described herein. Accordingly, a computer program product or program storage device that tangibly embodies such computer code devices may be provided in a manner apparent to those skilled in the art. The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention.

What is claimed is:

1. A method for modeling a semiconductor transistor device, the semiconductor transistor device having one or more liner films providing transistor stress effects, the method comprising:
   a) converting a representation of physical transistor design information into actual shape dimensions corresponding to said semiconductor transistor device;
   b) converting said actual shape dimensions into transistor device stress levels as contributed by said one or more liner films; and
   c) generating compact model parameters used in modeling a circuit performance comprising said semiconductor transistor device, said compact model parameters including model parameters based on computed stress levels and used in quantifying influence of said transistor stress effects when modeling said semiconductor transistor device.

2. The method as claimed in claim 1, wherein said step a) includes a step of extracting layout-dependent features of the semiconductor transistor device, said layout-dependent features are utilized to generate said actual shape dimensions.

3. The method as claimed in claim 2, wherein said step of extracting layout-dependent features of the semiconductor transistor device comprises:
   d) implementing a bucket structure having a first edge corresponding to a reference location associated with a gate structure of said semiconductor transistor device;
   e) expanding one or more additional edges of said bucket structure to detect features in a neighborhood of said gate structure defined by said first edge and one or more additional edges of said bucket structure; and
   f) generating instance parameters representing a layout of said features detected in said neighborhood.

4. The method as claimed in claim 3, wherein said step e) includes the step of expanding, relative to said reference location, said one or more additional edges of said bucket structure in opposite directions of said gate structure to detect features in said neighborhood.

5. The method as claimed in claim 3, wherein step f) includes measuring one or more of areas, perimeters, and vertice counts of layout shapes detected within said neighborhood.

6. The method as claimed in claim 5, wherein said layout shapes include local interconnect metal contact shapes.

7. The method as claimed in claim 5, wherein said layout shapes include a local polysilicon structure.

8. The method as claimed in claim 5, wherein step f) includes measuring a distance from said gate structure to an interface between one or more stress liner films applied to said semiconductor transistor device, said instance parameters including said measured distance.

9. The method as claimed in claim 8, further comprising: repeating steps a) through f) to generate instance parameters and measured stress liner film interface distances for each semiconductor transistor device in a circuit whose performance is to be modeled.

10. The method as claimed in claim 9, further comprising: writing said instance parameters representing said layout-dependent features generated for a semiconductor transistor device to an interface adapted to communicate with a compact model tool that computes stress as seen by said semiconductor transistor device.

11. The method as claimed in claim 10, wherein a step of writing said instance parameters representing layout-dependent features to a compact modeling tool comprises: directly passing layout shape information including a list of shape coordinates representing said layout-dependent features into the compact modeling tool.

12. The method as claimed in claim 10, further comprising scanning said instance parameters generated for a semiconductor transistor device utilizing information obtained from expanded adjacent bucket structures to compute size and position of rectangular shaped structures.

13. The method as claimed in claim 10, further comprising scanning said instance parameters generated for a semiconductor device utilizing information obtained from expanded adjacent bucket structures to reassemble complex shaped structures within said neighborhood of said gate structure.

14. The method as claimed in claim 10, further comprising: compiling a list of shape sizes and positions and stress liner film interface distances for computing said transistor device stress levels for each semiconductor transistor gate device.

15. The method as claimed in claim 9, further comprising: compressing the generated instance parameters representing said layout-dependent features into a compressed layout format and passing the compressed layout format to a compact modeling tool.

16. The method as claimed in claim 1, wherein said compact model parameters include channel carrier mobility that is adjusted to account for the influence of liner-stress.

17. The method as claimed in claim 1, further comprising: computing from the compact model parameters circuit-level quantities used in the simulation of circuits including the semiconductor transistor device.

18. The method as claimed in claim 1, wherein said transistor device levels represent average stress levels as seen by a channel of said semiconductor transistor device, said stress including longitudinal and transverse stress components.

19. The method as claimed in claim 18, wherein said semiconductor transistor device stress levels include a self-stress component representing the semiconductor transistor device in isolation with no features in a neighborhood of said gate structure that would influence stress.

20. The method as claimed in claim 1, wherein steps a) through c) include implementing compact model means for generating said compact model parameters used in modeling said semiconductor transistor device including those model parameters based on said computed stress levels.

21. The method as claimed in claim 1, wherein step b) includes implementing a stress model computing means for computing said transistor device stress levels and generating said model parameters based on said computed stress levels; and said step c) includes implementing compact model means that is independent from the stress model computing means and receives said model parameters therefrom, said compact model means for use in quantifying the influence of stress effects when modeling said semiconductor transistor device.

22. A system for modeling a semiconductor transistor device, the semiconductor transistor device having one or more liner films providing transistor stress effects, the system comprising:

an extracting means for processing a formatted representation of physical transistor design data corresponding to said semiconductor transistor device and generating layout-dependent information including non-specific feature shape information; and a compact model means for receiving said layout-dependent information and said non-specific feature shape information and computing transistor device stress levels, said compact model means further generates compact model parameters for use in modeling circuit performance of a circuit including said semiconductor transistor device, said compact model means provides compact model parameters adjusted according to said computed transistor device stress levels for use in quantifying influence of said transistor stress effects when modeling said circuit performance.

23. The system as claimed in claim 22, wherein said extracting means further comprises means for extracting layout-dependent features of the semiconductor transistor device, said layout-dependent features utilized to generate actual shape dimensions.

24. The system as claimed in claim 22, wherein a means for extracting layout-dependent features of the semiconductor transistor device comprises:

a bucket structure having a first edge corresponding to a reference location associated with a gate structure of said semiconductor transistor device, and one or more additional edges expandable to detect features in a neighborhood of said gate structure defined by said first edge and said one or more additional edges of said bucket structure; and means for generating instance parameters representing a layout of said features detected in said neighborhood.

25. The system as claimed in claim 24, wherein said means for extracting said layout-dependent features measures areas, perimeters, and vertice counts of layout shapes detected within said neighborhood.

26. The system as claimed in claim 25 wherein said layout shapes include local interconnect metal contact shapes.

27. The system as claimed in claim 25, wherein said layout shapes include a local polysilicon structure.

28. The system as claimed in claim 24, further comprising: means for measuring a distance from a gate structure to an interface between one or more stress liner films applied to said semiconductor transistor device, said instance parameters including said measured distance.

29. The system as claimed in claim 24, further comprising an interface means between a layout-dependent information generating means and said compact model means, said interface means receiving said instance parameters generated for said semiconductor transistor device and communicating said instance parameters to said compact model means.

30. A method for optimizing semiconductor transistor performance that considers effects of liner film stress applied to a semiconductor transistor device having one or more liner films, said method comprising:

a) receiving a representation of a circuit layout including said semiconductor transistor device;

b) extracting layout-dependent features of the semiconductor transistor device, said extracted layout-dependent features are utilized to generate said actual shape dimensions of semiconductor transistor device features;

c) converting actual shape dimensions into transistor stress levels as contributed by said one or more liner films;

d) simulating a circuit using a compact model tool, said simulating including utilizing compact model parameters adjusted according to said transistor stress levels; and e) modifying said circuit layout if said transistor device does not meet a performance goal, and repeating steps a) through e) until a performance goal for said circuit is achieved.

31. The method as claimed in claim 30, wherein said extracting step b) includes: generating layout-dependent information including non-specific feature shape information, said layout-dependent information further including stress parameter information.

32. The method as claimed in claim 31, wherein said step b) comprises:

f) implementing a bucket structure having a first edge corresponding to a reference location associated with said gate structure of said transistor device;

g) expanding one or more additional edges of said bucket structure to detect features in a neighborhood of a gate structure defined by said first edge and said one or more additional edges of said bucket structure; and h) generating instance parameters representing a layout of said features detected in said neighborhood.

33. The method as claimed in claim 32, wherein said step f) includes: measuring one or more of areas, perimeters, and vertice counts of layout shapes detected within said neighborhood.

34. The method as claimed in claim 32, wherein said step f) includes: measuring a distance from said gate structure to an interface between one or more stress liner films applied to said transistor device, said instance parameters including said measured distance.

35. A system for optimizing transistor performance that incorporates effects of liner film stress applied to a transistor device having one or more liner films, said system comprising:

a processing means for processing a representation of a circuit layout including said transistor device, said circuit layout representation including a formatted representation of physical transistor design data corresponding to said transistor device, said processing means further generating layout-dependent information including non-specific feature shape information, said layout-dependent information further including stress parameter information;

a compact model tool for modeling performance of a circuit including said transistor device, said compact model tool receiving said layout-dependent information, said non-specific feature shape information and said stress parameter information and computing stress levels as seen by said transistor device as contributed by said one or more liner films; and a means for determining if a performance goal for said circuit is met and, if the performance goal for said circuit is not met, modifying said circuit layout and generating a further circuit layout representation for input to said processing means for generating further layout-dependent information to be processed by said compact model tool, whereby said circuit layout is modified until the performance goal for said circuit is achieved.

36. The system as claimed in claim 35, wherein said compact model tool further comprises means for adjusting compact model parameters based on said computed stress levels that are used in quantifying influence of stress effects when modeling said transistor device included in said circuit.

37. The system as claimed in claim 35, wherein said compact model tool further comprises: means for extracting layout-dependent features of the transistor device, said layout-dependent features are utilized to generate actual feature shape dimensions.

38. The system for modeling a transistor device, the transistor device having one or more liner films providing transistor stress effects, the system comprising:

a means for processing a formatted representation of physical transistor design data corresponding to said transistor device and generating layout-dependent information including non-specific feature shape information;

a compact model means used in modeling circuit performance of a circuit including said semiconductor transistor device;

a means for receiving said generated layout-dependent information including non-specific feature shape information and independently computing transistor device stress levels, said means further generating corresponding compact model parameters based on said computed transistor device stress levels; and a circuit simulator utilizing said compact model means and said compact model parameters based on said computed transistor device stress levels for use in quantifying influence of stress effects when modeling said circuit performance.

* * * * *